United States Patent
Shinohara et al.

(10) Patent No.: US 7,847,314 B2
(45) Date of Patent: Dec. 7, 2010

(54) GALLIUM NITRIDE-BASED COMPOUND SEMICONDUCTOR LIGHT-EMITTING DEVICE

(75) Inventors: Hironao Shinohara, Ichihara (JP); Hisayuki Miki, Ichihara (JP); Noritaka Muraki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 249 days.

(21) Appl. No.: 12/065,970

(22) PCT Filed: Sep. 5, 2006

(86) PCT No.: PCT/JP2006/317930

§ 371 (c)(1),
(2), (4) Date: Mar. 6, 2008

(87) PCT Pub. No.: WO2007/029841

PCT Pub. Date: Mar. 15, 2007

(65) Prior Publication Data

US 2009/0152585 A1    Jun. 18, 2009

Related U.S. Application Data

(60) Provisional application No. 60/716,970, filed on Sep. 15, 2005.

(30) Foreign Application Priority Data

Sep. 6, 2005    (JP)    ............................. 2005-258184

(51) Int. Cl.
*H01L 21/20* (2006.01)
*H01L 21/00* (2006.01)

(52) U.S. Cl. ........................ 257/103; 257/94
(58) Field of Classification Search .................. 257/103
See application file for complete search history.

(56) References Cited

U.S. PATENT DOCUMENTS 6,365,923 B1    4/2002    Kamei (Continued)

FOREIGN PATENT DOCUMENTS

JP    2001-102623 A    4/2001

(Continued)

OTHER PUBLICATIONS

"Investigation of indium-tin-oxide ohmic contact to p-GaN and its application to high-brightness GaN-based light-emitting diodes", Kow-Ming Chang, et al., Solid-State Electronics 49, (2005) 1381-1386.

(Continued)

*Primary Examiner*—Bradley K Smith
*Assistant Examiner*—Mohammad Choudhry
(74) *Attorney, Agent, or Firm*—Sughrue Mion, PLLC

(57) ABSTRACT

It is an object of the present invention to provide a gallium nitride-based compound semiconductor light-emitting device that is excellent in light output efficiency and needs only a low driving voltage (Vf). The inventive gallium nitride-based compound semiconductor light-emitting device includes an n-type semiconductor layer, a light-emitting layer and a p-type semiconductor layer formed of a gallium nitride-based compound semiconductor and stacked in this order on a substrate, and positive and negative electrodes so arranged as to be in contact with the p-type semiconductor layer and the n-type semiconductor layer, respectively, wherein a region in which a p-type impurity and hydrogen atoms are co-present exists in the p-type semiconductor layer in contact with the positive electrode, and at least a portion, which is in contact with the p-type semiconductor layer, of the positive electrode, is formed of an n-type electro-conductive light transmitting material.

11 Claims, 2 Drawing Sheets

U.S. PATENT DOCUMENTS

| | | | |
|---|---|---|---|
| 6,479,313 B1 * | 11/2002 | Ye et al. | 438/47 |
| 2002/0000563 A1 * | 1/2002 | Udagawa | 257/94 |
| 2004/0113156 A1 | 6/2004 | Tamura et al. | |

FOREIGN PATENT DOCUMENTS

| | | | |
|---|---|---|---|
| JP | 2004-179365 A | 6/2004 | |

OTHER PUBLICATIONS

"Hydrogen Dissociation from Mg-doped GaN", Yoshinori Nakagawa, et al., Japanese Journal of Applied Physics, vol. 43, No. 1, 2004, pp. 23-29.

* cited by examiner

GALLIUM NITRIDE-BASED COMPOUND SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/716,970 filed on Sep. 15, 2005, pursuant to 35 U.S.C. §111(b).

TECHNICAL FIELD

This invention relates to a gallium nitride-based compound semiconductor light-emitting device. More particularly, the present invention relates to a gallium nitride-based compound semiconductor light-emitting device that has a low driving voltage (Vf) and is excellent in light output efficiency.

BACKGROUND ART

GaN-based compound semiconductor materials have drawn an increasing attention in recent years as semiconductor materials for short wavelength light-emitting devices. The GaN-based compound semiconductor is fabricated by using a sapphire single crystal, various other oxides and Group III-V compounds as a substrate and by applying an organic metal vapor phase chemical reaction method (MOCVD method) or a molecular beam epitaxy method onto the substrate.

One of the characteristic properties of GaN-based semiconductor materials is that current diffusion is small in a transverse direction. Therefore, a current can be injected only into the semiconductor immediately below electrodes and light emitted from a light-emitting layer is blocked by the electrodes and cannot be output. Therefore, a transparent electrode is ordinarily used as a positive electrode in the light-emitting devices of this type, and light is output through the positive electrode.

The positive electrode according to the prior art has a layer structure formed by combining an oxide of Ni or Co with Au as a contact metal in contact with a p-type semiconductor (for an example, refer to Japanese Patent No. 2,803,742). The film thickness of the contact metal has been minimized in recent years by using a metal oxide having higher electric conductivity such as ITO, and a layer structure that improves transparency without using a contact metal has been employed as the positive electrode (for an example, refer to Japanese Unexamined Utility Model Publication No. 6-38265).

The layer of the electrically conductive transparent material such as ITO has higher transmissivity for light than the layer of the oxide such as Ni or Co and can be formed into a relatively large thickness. Whereas the oxide of Ni or Co has a film thickness of from about 10 to about 50 nm, a thickness of 200 nm to 500 nm is utilized for the layer of ITO, etc. The conductive transparent material of an n-type such as ITO can improve light output efficiency owing to its high light transmissivity in comparison with Ni and Co. However, the problem remains in that a high contact resistance occurs with a p-type semiconductor because the material is n-type.

DISCLOSURE OF THE INVENTION

It is an object of the present invention to provide a gallium nitride-based compound semiconductor light-emitting device that solves the problems described above, is excellent in light output efficiency and needs only a low driving voltage (Vf).

The present invention provides the following inventions.

(1) A gallium nitride-based compound semiconductor light-emitting device including an n-type semiconductor layer, a light-emitting layer and a p-type semiconductor layer formed of a gallium nitride-based compound semiconductor and stacked in this order on a substrate, and positive and negative electrodes so arranged as to be in contact with the p-type semiconductor layer and the n-type semiconductor layer, respectively, wherein a region in which a p-type impurity and hydrogen atoms are co-present exists in the p-type semiconductor layer in contact with the positive electrode, and at least a portion, which is in contact with the p-type semiconductor layer, of the positive electrode, is formed of an n-type electro-conductive light transmitting material.

(2) The gallium nitride-based compound semiconductor light-emitting device according to (1) above, wherein a hydrogen atom concentration in the region in which the p-type impurity and the hydrogen atom are co-present is 1/10 to 2/1 with respect to a p-type impurity concentration.

(3) The gallium nitride-based compound semiconductor light-emitting device according to (2) above, wherein the hydrogen atom concentration in the region in which the p-type impurity and the hydrogen atom are co-present is 1/5 to 1.5/1 with respect to a p-type impurity concentration.

(4) The gallium nitride-based compound semiconductor light-emitting device according to (3) above, wherein the hydrogen atom concentration and the p-type impurity concentration are substantially equal to each other in the region in which the p-type impurity and the hydrogen atom are co-present.

(5) The gallium nitride-based compound semiconductor light-emitting device according to any one of (1) to (4) above, wherein the thickness of the region in which the p-type impurity and the hydrogen atom are co-present is at least 40% of the thickness of the whole p-type semiconductor layer in contact with the positive electrode.

(6) The gallium nitride-based compound semiconductor light-emitting device according to (5) above, wherein the thickness of the region in which the p-type impurity and the hydrogen atom are co-present is at least 70% of the thickness of the whole p-type semiconductor layer in contact with the positive electrode.

(7) The gallium nitride-based compound semiconductor light-emitting device according to any one of (1) to (6) above, wherein the n-type electro-conductive light transmitting material is at least one kind of material selected from the group consisting of ITO, $TiO_2$, ZnO, $Bi_2O_3$, MgO, ZnAlO, ZnS and $SnO_2$.

(8) The gallium nitride-based compound semiconductor light-emitting device according to (7) above, wherein the n-type electro-conductive light-emitting material contains at least ITO.

(9) The gallium nitride-based compound semiconductor light-emitting device according to any one of (1) to (8) above, wherein the thickness of the portion formed of the n-type electro-conductive light transmitting material of the positive electrode is 35 nm to 10 μm.

(10) The gallium nitride-based compound semiconductor light-emitting device according to (9) above, wherein the thickness of the portion formed of the n-type electro-conductive light transmitting material of the positive electrode is 100 nm to 1 μm.

(11) A lamp comprising a gallium nitride-based compound semiconductor light-emitting device according to any one of (1) to (10) above.

Hydrogen is allowed to exist in the p-type contact layer in contact with the positive electrode in the gallium nitride-based compound semiconductor device according to the invention. Therefore, a driving voltage (Vf) is low even when the n-type electro-conductive light transmitting material formed of a metal oxide having high light transmissivity such as ITO is directly disposed as the positive electrode on the p-type semiconductor layer.

When the n-type electro-conductive light transmitting material formed of the metal oxide having high transmissivity such as ITO is directly disposed as the positive electrode on the p-type semiconductor layer, it becomes possible to restrict absorption of light by the transparent electrode, to improve light output efficiency and to simplify the process because no other material is used.

BEST MODE FOR CARRYING OUT THE INVENTION

Figure 1:
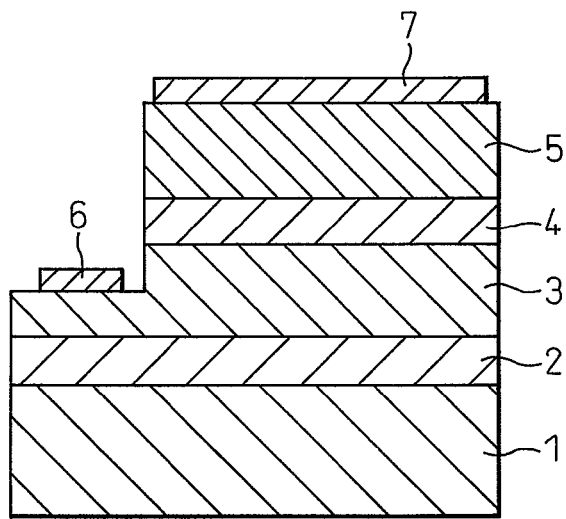
FIG. 1 schematically shows a Group III nitride semiconductor light-emitting device according to the invention.

In the gallium nitride-based compound semiconductor light-emitting device according to the invention, the material of the positive electrode, that is brought into direct contact with the p-type semiconductor layer, is a light transmitting electro-conductive material selected from the group consisting of ITO, $TiO_2$, ZnO, $BiO_2O_3$, MgO, ZnAlO, ZnS and $SnO_2$. Because these electro-conductive materials generally exhibit higher light transmitting property than metal thin films, they have excellent light output efficiency. ITO is particularly preferred.

Because these materials are of the n-type, however, it has not been possible to establish ohmic contact by bringing them into contact with the p-type semiconductor layer. The inventors of the present invention have found that these n-type electro-conductive light transmitting materials and the p-type semiconductor layer can establish an ohmic contact by allowing a p-type impurity and a hydrogen atom to be co-present in the p-type semiconductor layer.

The terms "light transmitting" and "transparent" do not necessarily mean that 100% light transmissivity is exhibited in all wavelength regions but means that a material has a function of passing light generated inside a semiconductor. Therefore, the terms are used for those films which are prepared by controlling materials and a film thickness so that light transmissivity of at least 50% can be achieved at a light emission wavelength.

The positive electrode, formed of the n-type electro-conductive light transmitting material described above, may be formed in such a fashion as to cover substantially the entire surface of the p-type semiconductor layer or in a grid form or a tree form having gaps. After the positive electrode is formed, alloying or thermal annealing treatment for improving transparency is conducted in some cases but such a treatment need not always be conducted.

The thickness of the n-type electro-conductive light transmitting layer constituting at least a part of the positive electrode is preferably from 35 nm to 10 µm. The drop of light transmissivity becomes remarkable when the thickness exceeds 10 µm. The thickness is further preferably from 50 nm to 1 µm when an interference effect is taken into consideration.

The film formation method of these materials to the p-type semiconductor layer is not particularly limited and a vacuum deposition method and a sputtering method, that are well known, can be employed. Vacuum deposition includes a resistance heating system and an electron beam heating system for the heating method but the electron beam heating method is suitable for vacuum deposition of materials other than a single metal such as a metal oxide. It is also possible to employ a method that first applies a solution of the metal compound as the starting material to the surface of the p-type semiconductor layer and then forms the solution into a metal oxide film by a necessary treatment such as heat treatment in an oxygen-containing atmosphere.

A bonding pad layer is generally disposed as the outermost layer of the positive electrode for the electrical connection with a circuit substrate or a lead frame. Various structures using materials such as Au, Al, Ni and Cu are known for the bonding pad layer, and various materials and various structures including these known materials and structures can be used without any limitation. The thickness is preferably from 100 to 1,000 nm. Bondability becomes high when the thickness is large due to the characteristics of the bonding pad. Therefore, the thickness is preferably at least 300 nm. From the aspect of the production cost, furthermore, the thickness is preferably not greater than 500 nm. The outermost layer is preferably formed of the material which has high adhesion with bonding balls, such as Au.

As the gallium nitride-based compound semiconductor device on which the positive electrode formed of the n-type electro-conductive light transmitting material described above is arranged, a gallium nitride-based compound semiconductor device having a structure in which a buffer layer 2, an n-type semiconductor layer 3, a light-emitting layer 4 and a p-type semiconductor layer 5 are serially allowed to grow as respective crystals on a substrate 1, a part of each of the light-emitting layer 4 and the p-type semiconductor layer 5 are etched away to expose the n-type semiconductor layer 3, a negative electrode 6 is disposed on the n-type semiconductor layer 3 so exposed and a positive electrode 7 is arranged on the remaining p-type semiconductor layer 5, is known. The positive electrode formed of the n-type electro-conductive light-emitting material according to the invention can be arranged without any limitation on the gallium nitride-based compound semiconductor device having such a structure.

Oxide single crystals such as sapphire single crystal ($Al_2O_3$; A plane, C plane, M plane, R plane), spinel single crystal ($MgAl_2O_4$), ZnO single crystal, $LiAlO_2$ single crystal, $LiGaO_2$ single crystal and MgO single crystal, Si single crystal, SiC single crystal, GaAs single crystal, AlN single crystal, GaN single crystal and boride single crystals such as $ZrB_2$ are known as the substrate materials. In the invention, any substrate material including these known substrate materials can be used without any limitation. Preferred among them are sapphire single crystal and SiC single crystal. Incidentally, the plane orientation of the substrate is not particularly limited. The substrate may be either a just-oriented substrate or a substrate to which an off angle is imparted.

The n-type semiconductor layer, the light-emitting layer and the p-type semiconductor layer, which are formed of the gallium nitride-based compound semiconductor, are generally stacked on the substrate through a buffer layer. The buffer layer is sometimes unnecessary depending on the substrate used and on the growing condition of the epitaxial layer.

A large number of gallium nitride-based compound semiconductors expressed by the formula $Al_XGa_YIn_ZN_{1-A}M_A$ ($0 \leq X \leq 1$, $0 \leq Y \leq 1$, $0 \leq Z \leq 1$ and $X+Y+Z=1$; M represents a Group V element different from nitrogen (N) and $0 \leq A<1$) are known as the gallium nitride-based compound semiconductors, and the gallium nitride-based compound semiconductors inclusive of these known semiconductors and expressed by the formula $Al_XGa_YIn_ZN_{1-A}M_A$ ($0 \leq X \leq 1$, $0 \leq Y \leq 1$, $0 \leq Z \leq 1$ and $X+Y+Z=1$; N represents a Group V element different from nitrogen (N) and $0 \leq A<1$) can be used without any limitation in the invention, too.

The gallium nitride-based compound semiconductor can contain the Group III elements besides Al, Ga and In, and can further contain Ge, Si, Mg, Ca, Zn, Be, P, As and B, whenever necessary. This compound semiconductor contains, in some cases, those impurities which are inevitably contained depending on the film formation condition, besides the elements that are deliberately added, and trace impurities that contained in the starting materials and in the materials of the reaction tube.

The growing method of the gallium nitride-based compound semiconductor is not particularly limited and all the methods that are known as being capable of growing the gallium nitride-based compound semiconductor such as MOCVD (Metal Organic Chemical Vapor Deposition), HVPE (Hydride Vapor Phase Epitaxy), MBE (Molecular Beam Epitaxy), and so forth, can be applied. A preferred growing method is the MOCVD method from the aspects of controllability of the film thickness and mass producibility. The MOCVD method uses hydrogen ($H_2$) or nitrogen ($N_2$) as a carrier gas, trimethylgallium (TMG) or triethylgallium (TEG) as a Ga source as the Group III raw material, trimethylaluminum (TMA) or triethylaluminum (TEA) as an Al source as the Group III raw material, trimethylindium (TMI) or triethylindium (TEI) as an In source as the Group III raw material and ammonia ($NH_3$), hydrazine ($N_2H_4$) and azide as an N source as the Group V raw material. As for dopants, it is possible to utilize monosilane ($SiH_4$) or disilane ($Si_2H_6$) for the n-type Si raw material and germane gas ($GeH_4$) or organic germanium compounds such as tetramethylgermanium (($CH_3$)$_4$Ge) or tetraethylgermanium (($C_2H_5$)$_4$Ge) for the Ge raw material. In MBE, elemental germanium may be utilized as the doping source.

Examples of the p-type impurity (dopant) added at the time of vapor phase growth of the p-type semiconductor layer include Group II elements such as Mg, zinc (Zn), beryllium (Be), calcium (Ca), strontium (Sr), barium (Ba), cadmium (Cd) and mercury (Hg). Amphoteric impurities belonging to the Group IV such as carbon (C) are possible but a Group II element such as Mg is preferably used as the p-type impurity. Examples of the Mg raw material include bis-cyclopentadienylmagnesium (bis-$Cp_2$Mg) and bis-ethylcyclopentadienylmagnesium (bis-Et$Cp_2$Mg).

In the present invention, the p-type impurity and the hydrogen atom are allowed to be co-present in the p-type semiconductor layer that is in contact with the positive electrode. The p-type semiconductor layer is generally constituted by a p-type cladding layer having greater band gap energy than the light-emitting layer and a p-type contact layer on which the positive electrode is arranged. However, the p-type contact layer may also serve as the p-type cladding layer. Therefore, it is the p-type contact layer in which the p-type impurity and the hydrogen atom are allowed to be co-present.

In order to provide satisfactory ohmic contact, to prevent the occurrence of cracks and to maintain excellent crystallinity, the p-type impurity such as Mg in the p-type contact layer is preferably added so that the atomic concentration of the impurity inside the layer is from $1 \times 10^{18}$ cm$^{-3}$ to $\mathbf{1 \times 10^{22}}$ cm$^{-3}$. The concentration of the p-type impurity in the p-type semiconductor layer can be quantitatively determined by analytical means such as ordinary secondary ion mass spectrometry (SIMS) and Auger electron spectroscopy (AES).

The thickness of the p-type contact layer is preferably from 0.01 to 0.5 μm, further preferably from 0.05 to 0.2 μm and most preferably 0.1 μm or below. The thickness of the p-type contact layer can be controlled by adjusting the feed time of the raw material of the Group III element to the growing reaction system when the vapor phase growth is conducted. The thickness of the p-type contact layer can be found by observation through an optical microscope, a scanning electron microscope (SEM) and a transmission electron microscope (TEM).

In the p-type contact layer having the thickness described above, the present invention does not intentionally dissipate the hydrogen atom from the layer but allows the hydrogen atom to exist at a deep portion of the layer. The term "deep portion" means the portion apart from the surface of the p-type contact layer and is the region on the side of the light-emitting layer. In the region where the hydrogen atom is deliberately allowed to exist, the ratio of the atomic concentration between the p-type impurity and the hydrogen atom deliberately allowed to exist (hydrogen atom/p-type impurity) is preferably 1/10 to 2/1 and is further preferably 1/5 to 1.5/1. More preferably, the ratio is substantially 1/1. The p-type impurity that is added and the hydrogen atom that is deliberately allowed to exist together form quantitatively an electrically inactive composite inside this region. The p-type impurity and the hydrogen atom can be quantitatively determined by analytical means such as SIMS. Quantitative determination by SIMS is conducted for the portion at which a profile curve is flat.

The hydrogen atom that is deliberately allowed to exist so as to make the p-type impurity electrically inactive lowers a forward voltage (Vf) and a threshold voltage (Vth) and for this purpose, a region (thickness) exceeding a predetermined level is necessary. For example, the thickness is at least 40% of the total thickness of the p-type contact layer. Preferably, it is a region exceeding 70% of the total thickness of the p-type contact layer.

The heat treatment means according to the prior art that deliberately expels almost all the hydrogen atoms constituting the electrically inactive composite together with the p-type impurity added outside the layer does not operate as sufficient technical means for deliberately causing the hydrogen atoms to remain in the specific region according to the invention. In the invention, after the layer containing the p-type impurity is formed by adding the p-type impurity, the heat treatment is carried out in the atmosphere consisting primarily of an inert gas to form a region where some of the hydrogen atoms are deliberately allowed to remain. The growing furnace used for growing may be used for this heat treatment.

In the cooling process, after the growth of the p-type contact layer is completed, this layer is cooled at a controlled rate inside the atmosphere consisting primarily of the inert gas to form the region in which some of the hydrogen atoms are allowed to remain. When the temperature at which cooling is started (that is the formation temperature of the p-type contact layer, for example) is the same, the width (thickness) of the region in which the hydrogen atoms are deliberately allowed to remain decreases when the cooling rate is great. When the cooling rate is the same, the width (thickness) of the region in which the hydrogen atoms are deliberately allowed to remain decreases when the cooling starting temperature is high.

Cooling of the p-type contact layer can be conducted in a mixed atmosphere of an inert gas such as nitrogen ($N_2$), argon (Ar) or helium (He) with a hydrogen ($H_2$) gas. When cooling is conducted inside the atmosphere having a greater hydrogen volume ratio, the width (thickness) of the region in which the hydrogen atom is deliberately allowed to remain is increased.

The width (thickness) of the region in which a part of the hydrogen atoms is deliberately allowed to remain varies depending on the shape of the cooling apparatus besides the cooling starting temperature, the cooling rate and the construction of the atmosphere. Therefore, though it is not possible to primarily determine the cooling rate, the cooling rate suitable for forming the region in which the hydrogen atom is deliberately allowed to remain is generally from 40 to 120° C. per minute when the GaN layer doped with Mg is cooled from 1,050° C. as a growing temperature to the room temperature inside the mixed atmosphere of 95 vol % nitrogen and 5 vol % hydrogen. In the case of an aluminum-containing layer such as an $Al_xGa_yN$ (0<X, Y<1, X+Y=1) layer, a smaller (slower) cooling rate is permissible.

The distribution of the atomic concentration of the p-type impurity doped into the p-type contact layer hardly changes even when the cooling rate and the construction of the atmospheric gas at the time of cooling are changed. Therefore, when cooling rate dependence of the decrement ratio of the hydrogen atoms contained in the p-type contact layer is in advance examined, it becomes possible to form a region having the atomic concentration of about 1:1 between the p-type impurity and the hydrogen atom at the deep portion of the p-type contact layer by adjusting the cooling rate, etc, on the basis of this decrement ratio.

The characteristics of the n-type electro-conductive light transmitting material, particularly the carrier concentration can be changed by changing the material and the composition. A low resistance region containing large amounts of the p-type impurity that is electrically activated can be formed in the surface layer region of the p-type contact layer by decreasing the concentration of the hydrogen atoms in accordance with the characteristics of the n-type electro-conductive light transmitting material. It is effective to conduct cooling in an atmosphere composed of only an inert gas. It is effective to conduct cooling in an atmosphere composed of nitrogen, argon or helium, for example. Concretely, after the p-type contact layer is grown by the MOCVD method, for example, the hydrogen gas constituting the atmosphere at the time of the growth is switched to an atmosphere composed mainly of nitrogen gas and cooling is conducted. Consequently, the region that deliberately contains a large amount of hydrogen atoms is formed at a deep portion of the p-type contact layer in an atmosphere containing hydrogen gas at the preferred ratio described above at the time of cooling, and cooling is thereafter conducted by changing the gas constituting the atmosphere to the atmosphere composed mainly of the inert gas so as to form a high resistance region at the deep portion in which a large amount of hydrogen atoms is deliberately allowed to remain and at the same time, to form the p-type contact layer as the low resistance region at the surface layer region in which the concentration of the hydrogen atoms is not higher than ⅓ of the hydrogen concentration of the region at the deep portion.

The cooling rate at the time of the formation of the low resistance region in the surface layer region of the p-type contact layer is preferably greater (faster) than the cooling rate employed for forming the region at the deep portion in which a large amount of hydrogen atoms are allowed to remain. It may be conceivable to carry out the cooling operation for forming the low resistance layer in the surface layer region of the p-type contact layer in an atmosphere mainly consisting of a gas of a compound composed of hydrogen and nitrogen such as ammonia ($NH_3$) but this is not desirable because hydrogen (atomic) emitted owing to the release of the chemical bond between hydrogen and nitrogen in some cases invades the surface layer region of the p-type contact layer during cooling.

As for the n-type semiconductor layer and the light-emitting layer, those having various compositions and various structures are known and those including such known layers can be used in the invention without any limitation. Various compositions and various structures are also well known for the negative electrodes, and the negative electrodes including these known electrodes can be used in the invention without any limitation.

The gallium nitride-based compound semiconductor light-emitting device according to the invention can be used to constitute a lamp by integrally adding a transparent cover by means that are well known in this art. A white lamp can also be produced by combining the gallium nitride-based compound semiconductor light-emitting device of the invention with a cover containing a phosphor.

EXAMPLES

The invention will be hereinafter explained in detail with reference to its examples but the invention is not limited to only these examples.

Example 1

This example will concretely explain a GaN-based semiconductor LED having an ITO positive electrode that is directly arranged on a p-type GaN semiconductor layer inclusive of a region in which hydrogen is deliberately allowed to remain.

Figure 2:
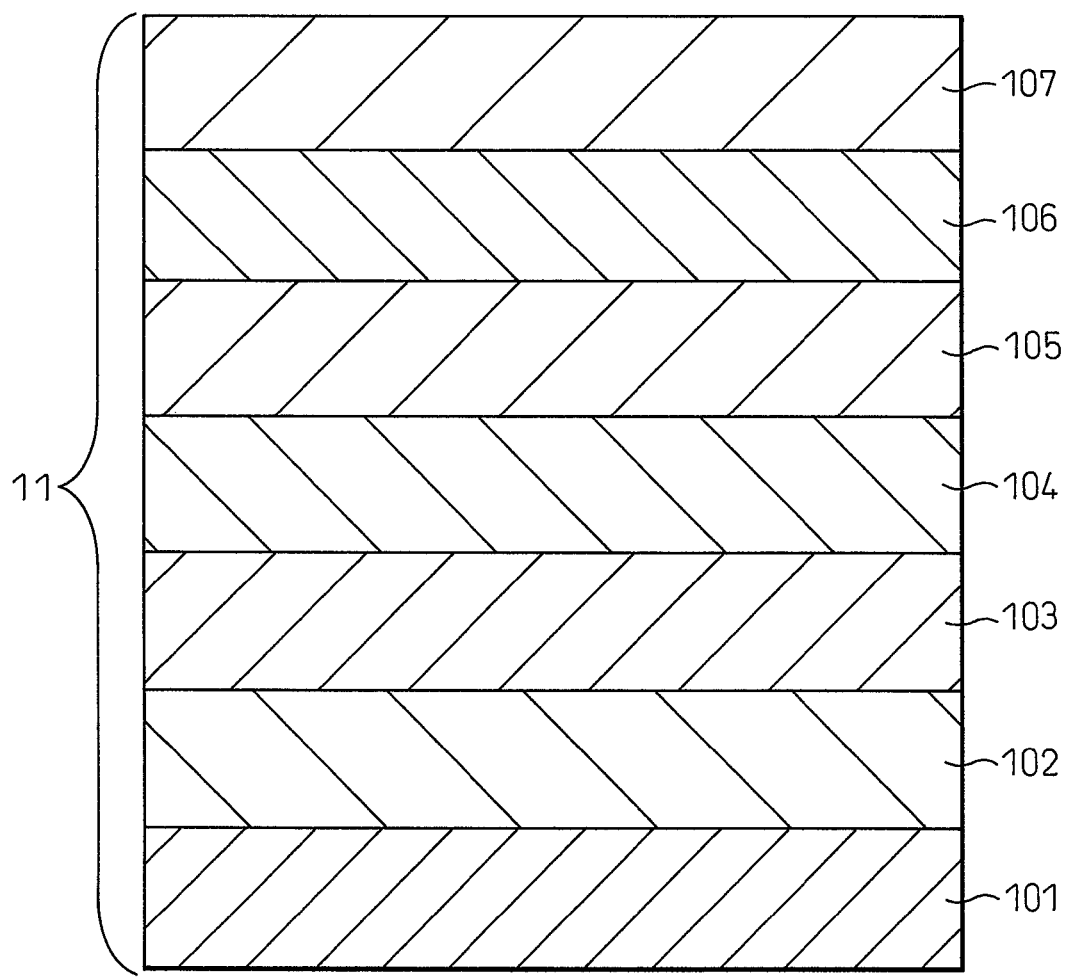
FIG. 2 is a schematic sectional view of epitaxial stacked structure produced in Examples 1 and 2.
Figure 3:
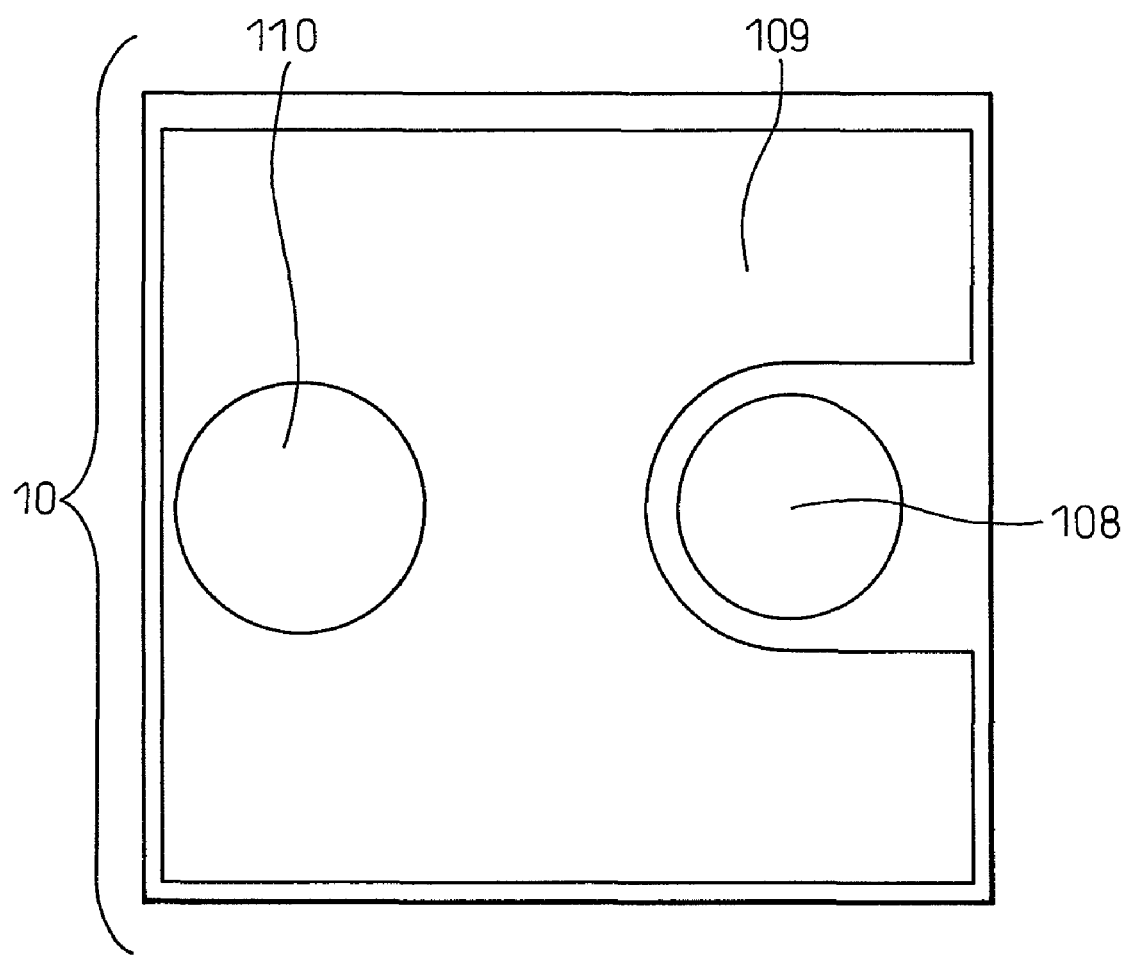
FIG. 3 is a schematic plan view of the LED produced in Examples 1 and 2.

FIG. 2 shows a schematic sectional view of an epitaxial stacked structure 11 used for fabricating the LED 10 described in this example. FIG. 3 shows a schematic plan view of the LED 10.

On a substrate 101, consisting of a c plane ((0001) crystal plane) of a sapphire in a stacked structure 11, are serially stacked, through a buffer layer formed of AlN (not shown), an undoped GaN layer (layer thickness=2 μm) 102, a silicon (Si) doped n-type GaN layer (layer thickness=2 μm, carrier concentration=$1 \times 10^{19}$ $cm^{-3}$) 103, a Si doped n-type $Al_{0.07}Ga_{0.93}N$ cladding layer (layer thickness=12.5 nm, carrier concentration=$1 \times 10^{18}$ $cm^{-3}$) 104, a light-emitting layer 105 having multiple quantum well structure that includes 6 layers of Si doped GaN barrier layers (layer thickness=14.0 nm, carrier concentration=$1 \times 10^{18}$ $cm^{-3}$) and 5 layers of undoped $In_{0.20}Ga_{0.80}N$ well layers (layer thickness=2.5 nm), a Mg doped p-type $Al_{0.07}Ga_{0.93}N$ cladding layer (layer thickness=10 nm) 106 and a Mg doped p-type GaN contact layer (layer thickness=100 nm) 107. Each of the constituent layers 102 to 107 of the stacked structure 11 is grown by an ordinary vacuum MOCVD means.

The Mg doped p-type GaN contact layer 107, in particular, is grown by the following procedure.

(1) After the growth of the Mg doped p-type $Al_{0.07}Ga_{0.93}N$ cladding layer 106 is completed, the pressure inside a growing reaction furnace is set to $2 \times 10^4$ Pascal (Pa).

(2) Gaseous phase growth of the Mg doped p-type GaN layer is started at 1,050° C. by using trimethylgallium and ammonia as the starting materials and bis-cyclopentamagnesium (bis-Cp$_2$Mg) as a doping source of Mg.

(3) Trimethylgallium, ammonia and the doping source of Mg are continuously supplied into the growing reaction furnace in the course of 4 minutes to grow a Mg doped p-type GaN layer having a layer thickness of 0.1 μm.

(4) The supply of trimethylgallium and bis-Cp$_2$Mg into the growing reaction surface is stopped and the growth of the Mg doped p-type GaN layer is stopped.

Immediately after the gaseous phase growth of the p-type contact layer 107 composed of the Mg doped GaN layer is completed, the supply of power to a radio frequency induction heater, that is utilized for heating the substrate 101, is stopped. Cooling of the stacked structure 11 inside the growing reaction furnace in which each constituent layer 102 to 107 is allowed to grow in the gaseous phase is started. The atmosphere at the time of cooling is formed by mixing nitrogen with the hydrogen carrier gas used for the gaseous phase growth of each constituent layer of the stacked structure 11. The mixing ratio of nitrogen and hydrogen is 95:5 by a volume ratio. Under this state, the temperature of the substrate is lowered to the room temperature in the course of 20 minutes. In other words, the mean cooling rate is 53° C. per minute.

After cooling is done down to room temperature, the stacked structure 11 is taken out from the growing reaction furnace and the atomic concentrations of magnesium and hydrogen in the contact layer 107 composed of the Mg doped GaN layer are quantitatively determined by an ordinary SIMS analysis. The Mg atoms are distributed at a concentration of $7\times10^{19}$ cm$^{-3}$ from the surface into the direction of depth with a substantially constant concentration. On the other hand, the content of the hydrogen atoms is as small as about $2\times10^{19}$ cm$^{-3}$ in the surface region but exists in a substantially constant concentration of $6\times10^{19}$ cm$^{-3}$ at the depth of 30 nm or more from the surface. It is therefore demonstrated that a region having a ratio of the atomic concentration between Mg and hydrogen of about 1:1 is formed at the deepest part of the Mg doped p-type GaN layer 107 extending from the junction interface with the lower layer 106 to the thickness of 70 nm in the increasing direction of the thickness. The resistance of this region is estimated to be about 2 kΩ from the current-voltage characteristics (I–V).

An LED 10 is produced by using the stacked structure 11 equipped with the p-type contact layer 107. First, ordinary dry etching is applied to a region in which an n-type ohmic electrode 108 is to be formed and the surface of the Si doped GaN layer 103 is exposed only in this region. An n-type ohmic electrode 108 including titanium (Ti) and aluminum (Al) stacked with each other is formed. A p-type ohmic electrode 109 composed of a 350 nm-thick ITO is formed on the substantially entire surface of the p-type contact layer including a region in which hydrogen is deliberately left. Further, a positive electrode bonding pad 110 is formed on the p-type omic electrode 109 by serially stacking Ti, Au, Al and Au in this order (with Ti being positioned on the ohmic electrode side).

After the positive electrode bonding pad 110 is formed, the back of the sapphire substrate 101 is polished, by using abrasives such as diamond fine powder, finally to a mirror surface. The stacked structure 11 is thereafter diced into discrete 350 μm square LEDs 10. Each LED 10 is put on a lead frame and is wired to the lead frame with a gold (Au) wire.

Electrical characteristics and light emission characteristics are measured by causing a forward current to flow between ohmic electrodes 108 and 109 of the LED so mounted. A forward voltage (Vf) is 3.2 V when the forward current is 20 mA. The wavelength of emitted light transmitting to the outside is 455 nm. A light emission output measured by an ordinary integrating sphere is 10 mW. LED having such characteristics can be obtained without variance for about 10,000 LEDs (products exclusive of those LED which have defective appearance) formed on substantially the entire surface of a disc substrate having a diameter of 2 inches.

A simple dielectric-breakdown test is carried out for the LED 10. Assuming that static electricity is abruptly applied, a pulse (plus) voltage is instantaneously applied between the electrodes and short-circuit between the electrodes in the reverse direction is thereafter examined. Among 100 samples, the number of LED that are broken by the application of a 1,000 V pulse voltage is only one. In other words, the defect occurrence ratio of the reverse voltage (Vr) is 1%.

Example 2

This example will explain a GaN-based semiconductor LED onto which an ITO electrode is brought into direct contact, on a p-type GaN semiconductor layer including a region in which hydrogen is deliberately allowed to remain by using a different condition from Example 1.

FIG. 2 is a schematic sectional view of an epitaxial stacked structure 11 used to produce the LED 10 of this example. FIG. 3 is a schematic plan view of the LED 10.

On a substrate 101, consisting of a c plane ((0001) crystal plane) of a sapphire in the stacked structure 11, are serially stacked, through a buffer layer formed of AlN (not shown), an undoped GaN layer (layer thickness=2 μm) 102, a silicon (Si) doped n-type GaN layer (layer thickness=2 μm, carrier concentration=$1\times10^{19}$ cm$^{-3}$) 103, a Si doped n-type Al$_{0.07}$Ga$_{0.93}$N cladding layer (layer thickness=12.5 nm, carrier concentration=$1\times10^{18}$ cm$^{-3}$) 104, a light-emitting layer 105 having a multiple quantum well structure including 6 layers of Si doped GaN barrier layers (layer thickness=14.0 nm, carrier concentration =$1\times10^{18}$ cm$^{-3}$) and 5 layers of undoped In$_{0.20}$Ga$_{0.80}$N well layers (layer thickness=2.5 nm), a Mg doped p-type Al$_{0.07}$Ga$_{0.93}$N cladding layer (layer thickness=10 nm) 106 and a Mg doped p-type GaN contact layer (layer thickness =100 nm) 107. Each of the constituent layers 102 to 107 of the stacked structure 11 is allowed to grow by an ordinary vacuum MOCVD means.

The Mg doped p-type GaN contact layer 107, in particular, is allowed to grow by the following procedure.

(1) After the growth of the Mg doped p-type Al$_{0.07}$Ga$_{0.93}$N cladding layer 106 is completed, the pressure inside a growing reaction furnace is set to $2\times10^4$ Pascal (Pa).

(2). Gaseous phase growth of the Mg doped p-type GaN layer is started at 1,050° C. by using trimethylgallium and ammonia as the starting materials and bis-cyclopentamagnesium (bis-Cp$_2$Mg) as a doping source of Mg.

(3) Trimethylgallium, ammonia and the doping source of Mg are continuously supplied into the growing reaction furnace in the course of 4 minutes to grow a Mg doped p-type GaN layer having a layer thickness of 0.1 μm.

(4) The supply of trimethylgallium and bis-Cp$_2$Mg into the growing reaction surface is stopped and the growth of the Mg doped p-type GaN layer is stopped.

Immediately after the gaseous phase growth of the p-type contact layer 107 composed of the Mg doped GaN layer is completed, the supply of power to a radio frequency induction heater, that is utilized for heating the substrate 101, is stopped. Cooling of the stacked structure 11 inside the growing reaction furnace, in which each constituent layer 102 to 107 is allowed to grow in the gaseous phase, is started. The atmosphere at the time of cooling is formed by mixing ammonia with the hydrogen carrier gas used for the gaseous phase growth of each constituent layer of the stacked structure 11. Ammonia has a concentration of 0.2% of hydrogen by volume ratio. Under this state, the temperature of the substrate is lowered to 800° C. in the course of 1 minute and 30 seconds, the supply of ammonia is stopped and the temperature is then lowered to the room temperature. In other words, the mean cooling rate is 53° C. per minute in the same way as in Example 1.

After cooling is done down to room temperature, the stacked structure 11 is taken out from the growing reaction furnace and the atomic concentrations of magnesium and hydrogen in the p-type contact layer 107 composed of the Mg doped GaN layer are quantitatively determined in the same way as in Example 1. The Mg atoms are distributed at a concentration of $1.5 \times 10^{20}$ cm$^{-3}$ from the surface into the direction of depth with a substantially constant concentration. On the other hand, the content of the hydrogen atoms is substantially constant at about $7.5 \times 10^{19}$ cm$^{-3}$. Therefore, the ratio of the atomic concentration between Mg and hydrogen is substantially 2:1 in the Mg doped p-type GaN layer. The resistance of this region is estimated to be about 2 kΩ from the current-voltage characteristics (I–V).

An LED 10 is produced by forming the ITO, etc, on the stacked structure 11 equipped with the p-type contact layer 107 in the same way as in Example 1.

The stacked structure 11 is thereafter diced into discrete 350 µm square LEDs 10 in the same way as in Example 1 and each LED 10 is then put on a lead frame and is wired to the lead frame with a gold (Au) wire.

Electrical characteristics and light emission characteristics are measured by causing a forward current to flow between ohmic electrodes 108 and 109 of the LED so mounted. A forward voltage (Vf) is 3.1 V when the forward current is 20 mA. The wavelength of emitted light transmitting to the outside is 455 nm. A light emission output measured by an ordinary integrating sphere is 10.5 mW. LED having such characteristics can be obtained without variance for about 10,000 LEDs (products exclusive of those LED having defective appearance) formed on an substantial entire surface of a disc substrate having a diameter of 2 inches.

A simple dielectric breakdown test is carried out for the LED 10 in the same way as in Example 1. Assuming that static electricity is abruptly applied, a pulse (plus) voltage is instantaneously applied between the electrodes and short-circuit between the electrodes in the reverse direction is thereafter examined. Among 100 samples, the number of LED that is broken by the application of a 1,000 V pulse voltage is only one. In other words, the defect occurrence ratio of the reverse voltage (Vr) is 1%.

INDUSTRIAL APPLICABILITY

The gallium nitride-based compound semiconductor light-emitting device according to the invention has excellent light emission output and a lower driving voltage. Therefore, its industrial utility is extremely great.

The invention claimed is:

1. A gallium nitride-based compound semiconductor light-emitting device including:
an n-type semiconductor layer,
a light-emitting layer, and
a p-type semiconductor layer formed of a gallium nitride-based compound semiconductor and stacked in this order on a substrate, and
positive and negative electrodes so arranged as to be in contact with the p-type semiconductor layer and the n-type semiconductor layer, respectively, wherein a region in which a p-type impurity and hydrogen atoms are co-present exists in the p-type semiconductor layer in contact with the positive electrode, and at least a portion, which is in contact with the p-type semiconductor layer, of the positive electrode is formed of an n-type electro-conductive light transmitting material.

2. The gallium nitride-based compound semiconductor light-emitting device according to claim 1, wherein a hydrogen atom concentration in the region in which the p-type impurity and the hydrogen atom are co-present is 1/10 to 2/1 with respect to a p-type impurity concentration.

3. The gallium nitride-based compound semiconductor light-emitting device according to claim 2, wherein the hydrogen atom concentration in the region in which the p-type impurity and the hydrogen atom are co-present is 1/5 to 1.5/1 with respect to the p-type impurity concentration.

4. The gallium nitride-based compound semiconductor light- emitting device according to claim 3, wherein the hydrogen atom concentration and the p-type impurity concentration are substantially equal to each other in the region in which the p-type impurity and the hydrogen atoms are co-present.

5. The gallium nitride-based compound semiconductor light-emitting device according to claim 1, wherein a thickness of the region in which the p-type impurity and the hydrogen atoms are co-present is at least 40% of a thickness of an entire p-type semiconductor layer in contact with the positive electrode.

6. The gallium nitride-based compound semiconductor light-emitting device according to claim 5, wherein the thickness of the region in which the p-type impurity and the hydrogen atoms are co-present is at least 70% of the thickness of the entire p-type semiconductor layer in contact with the positive electrode.

7. The gallium nitride-based compound semiconductor light-emitting device according to claim 1, wherein the n-type electro-conductive light transmitting material is at least one kind of material selected from the group consisting of ITO, $TiO_2$, ZnO, $Bi_2O_3$, MgO, ZnAlO, ZnS and $SnO_2$.

8. The gallium nitride-based compound semiconductor light-emitting device according to claim 7, wherein the n-type electro-conductive light-emitting material contains at least ITO.

9. The gallium nitride-based compound semiconductor light- emitting device according to claim 1, wherein a thickness of the portion formed of the n-type electro-conductive light transmitting material of the positive electrode is 35 nm to 10 µm.

10. The gallium nitride-based compound semiconductor light-emitting device according to claim 9, wherein the thickness of the portion formed of the n-type electro-conductive light transmitting material of the positive electrode is 100 nm to 1 µm.

11. A lamp comprising a gallium nitride-based compound semiconductor light-emitting device according to claim 1.

* * * * *